United States Patent
Kuth et al.

(10) Patent No.: US 7,411,398 B2
(45) Date of Patent: Aug. 12, 2008

(54) MRI APPARATUS USING PERIODIC GRADIENTS WHICH CHANGE IN PERIODICITY WITHIN EACH REPETITION, IN ONE SPATIAL DIRECTION

(75) Inventors: Rainer Kuth, Höchstadt (DE); Arnulf Oppelt, Spardorf (DE)

(73) Assignee: Siemens Aktiengesellschaft, Munich (DE)

( * ) Notice: Subject to any disclaimer, the term of this patent is extended or adjusted under 35 U.S.C. 154(b) by 38 days.

(21) Appl. No.: 11/436,373

(22) Filed: May 17, 2006

(65) Prior Publication Data

US 2006/0273796 A1    Dec. 7, 2006

(30) Foreign Application Priority Data

May 17, 2005   (DE)   ............. 10 2005 022 549

(51) Int. Cl.
*G01V 3/00* (2006.01)
(52) U.S. Cl. ............. 324/318; 324/307; 324/309
(58) Field of Classification Search ........ 324/300–322; 600/410, 411
See application file for complete search history.

(56) References Cited

U.S. PATENT DOCUMENTS

| | | | |
|---|---|---|---|
| 4,307,343 A * | 12/1981 | Likes | 324/307 |
| 5,274,331 A * | 12/1993 | Macovski | 324/309 |
| 5,296,808 A * | 3/1994 | Macovski | 324/309 |
| 6,255,821 B1 | 7/2001 | Oppelt | |
| 6,329,821 B1 * | 12/2001 | Zhou | 324/318 |
| 6,380,738 B1 * | 4/2002 | Zhou | 324/309 |
| 6,476,607 B1 * | 11/2002 | Dannels et al. | 324/309 |
| 6,597,173 B1 | 7/2003 | Bernstein | |
| 7,009,396 B2 * | 3/2006 | Zhu et al. | 324/309 |
| 7,047,062 B2 * | 5/2006 | Licato et al. | 600/410 |
| 2003/0216633 A1 * | 11/2003 | Licato et al. | 600/410 |
| 2004/0051529 A1 * | 3/2004 | Zhu et al. | 324/318 |
| 2005/0174116 A1 | 8/2005 | Leussler et al. | |
| 2006/0055404 A1 * | 3/2006 | Volke et al. | 324/307 |
| 2006/0061360 A1 | 3/2006 | Leussler et al. | |
| 2006/0273796 A1 * | 12/2006 | Kuth et al. | 324/318 |

FOREIGN PATENT DOCUMENTS

EP   1398642   *  3/2004
WO   WO 99/27381   6/1999

* cited by examiner

*Primary Examiner*—Brij Shrivastav
*Assistant Examiner*—Tiffany A Fetzner
(74) *Attorney, Agent, or Firm*—Schiff Hardin LLP

(57) ABSTRACT

A magnetic resonance apparatus has a transmission and reception coil system and a gradient coil system that is designed to generate a gradient field that is periodic in one spatial direction. The gradient field and/or the examination subject can be displaced in the spatial direction of the periodicity to generate a relative position change between the periodic gradient field and an examination subject, and the transmission and reception coil system comprises individually-activatable coil arrays to allow data to be acquired to fill in gaps or resolve ambiguous data entries that occur due to the gradient field being periodic.

12 Claims, 2 Drawing Sheets

MRI APPARATUS USING PERIODIC GRADIENTS WHICH CHANGE IN PERIODICITY WITHIN EACH REPETITION, IN ONE SPATIAL DIRECTION

BACKGROUND OF THE INVENTION

1. Field of the Invention

The present invention concerns a magnetic resonance apparatus of the type having a transmission and reception (RF) coil system and a gradient coil system that is designed to generate a gradient field that is periodic in one spatial direction, wherein the gradient field and/or the examination subject can be displaced in the spatial direction of the periodicity to produce a relative position change between the periodic gradient field and the examination subject.

2. Description of the Prior Art

In order to shorten the measurement (data acquisition) time in magnetic resonance apparatuses so that more patients can be examined with a single apparatus and the time of residence for the individual patients in the scanner is decreased, a conventional approach has been to increase the gradient field strengths and to shorten the switching times. There are limits to this procedure because (due to conductivity in the tissue of the patient) voltages can be induced that are sensed as painful or manifest themselves in uncomfortable muscle convulsions. In order to prevent such stimulations but use a very short measurement time, it is known from DE 198 43 463 C2 to use a magnetic field gradient that is periodic in one spatial direction. The gradient field described therein proposed exhibits a field curve that is generally sinusoidal but is flat in places, such that in these regions no spatial resolution can be achieved, for which it is proposed to implement a further measurement with a gradient field displaced in the spatial direction of the periodicity. This displacement can also be achieved in the examination subject being displaced in the spatial direction of the periodicity.

Due to the rising and falling edges of such periodic gradient fields, however, dual possibilities exist with regard to the spatial association, which must be addressed by suitable measures. In this context, from DE 198 43 463 C2 it is known to associate various segments in the spatial direction of the periodicity with respective separate sub-systems of an antenna system for transmission or reception. The spatial selection that can be achieved in such an arrangement, however, is limited.

SUMMARY OF THE INVENTION

An object of the present invention is to provide a magnetic resonance apparatus of the above type that allows a better spatial selection.

This object is achieved in accordance with the present invention by a magnetic resonance apparatus of the type described above wherein the transmission and reception coil system is composed of coil arrays that can be activated individually.

A further, spatially more precise rendering is therewith possible with regard to measurement results that are acquired in a magnetic resonance measurement. Targeted individual areas in the body region of the examination subject can be selected for an excitation with the individually-activatable coil arrays. In the measurement evaluation, in which (among other things) equation systems are to be evaluated, worthwhile additional information is thus acquired in order to safely avoid or to resolve data entries having an ambiguous (duplication) spatial coding, for example at signal edges at which the periodic gradient exhibits equal values. The radio-frequency excitation can be specifically directed to chosen body regions with the aid of the individually-activatable coil arrays.

The undertaking of the relative position change in order to fill information gaps in the peak region of a gradient field or the association of antenna systems with segments in order to resolve double entries are thus supplemented or improved.

As used herein, "ambiguous data" encompasses both the situation of ambiguous spatial coding and the existence of data (information) gaps.

The coil arrays are preferably distributed at least partially around the body of the examination subject. A broad distribution around the body region allows optimal, precise excitation of all conceivable examination areas by means of the individually-activatable coil arrays, and allows the resulting MR signals to be precisely associated with a corresponding body region. It is reasonable to associate a larger number of coil elements or arrays with respective body regions in which a higher spatial resolution is required (such as, for example, the head) with regard to the given examination volume. A coil array can be composed of a number of individual coil elements, and a number of arrays with, for example, approximately ten individual elements can be used for a single examination region.

According to the invention, the coil arrays can be distributed around the entire body volume of the examination subject. With such a magnetic resonance apparatus, a whole-body examination of the patient is possible without impairment with regard to the spatial resolution due to double entries and the like. The coil arrays can be generally freely distributed around the body in order to thus specifically improve the spatial resolution in specific regions. A fixed association with specific segment thus does not exist. What is decisive is merely that sufficient coil arrays are used in order to adequately cover the entire examination region (thus the entire body volume given a whole-body examination), such that a spatial association with the desired precision is possible.

A selective excitation of specific regions of the body of the examination subject can be producible by a suitable phase and/or amplitude modulation. By means of signal shifting or summing in individual coil elements of an array or of multiple arrays, interference patterns are produced given the superimposition of waves, which allow a spatially-precise excitation with regard to the volume of the examination subject. A significantly more precise spatial selection is by possible in comparison with a purely local arrangement of transmission and reception coils.

In accordance with the invention the gradient field and/or the examination subject can be displaced continuously or in stages. Given a displacement in stages, upon achieving the second position of the examination subject or, respectively, of the gradient field a further data acquisition or a new data acquisition cycle (i.e. a repetition) can be initiated. Alternatively, the displacement can ensue continuously in order to achieve a complete coverage of a given overall volume of the examination subject after a finite time. The continuous displacement during a data acquisition sequence can be implemented without further time losses, but in the evaluation high requirements are placed on the temporal precision. Given displacement in stages, a new data acquisition cycle is implemented that supplements the original image acquisition with regard to still-extant image gaps and inaccuracies, for example with regard to an ambiguous spatial association.

The gradient field can be displaceable by the superimposition of a further (in particular, likewise periodic) gradient field. For this purpose, two independent conductor systems at a specific distance from one another in the axial direction are used, with an effective movement of the field being achieved in space by a linear superposition of the respective magnetic fields. For this, the respective applied currents to the gradient coil are varied between a minimal value and a maximal value in order to obtain respectively different spatial positions of the resulting periodic gradient field.

At least one periodic gradient field can be fashioned in a sawtooth manner or as a smoothly varying wave. A sawtooth shape is one very simple possibility to produce a periodicity. An exact sawtooth curve with sharp peaks cannot be assumed, however, since a continuous transition in the gradients is necessary. Field curves are therefore achieved for the most part that are linear only in segments and at least approximately form a smooth wave, for example a sinusoidal wave. With such a gradient field it is possible to derive the spatial variation of the magnetization from a measured signal, and the image reconstruction can be achieved based on the phase coding properties with the coil array as well as the displacement of the gradient field or of the examination subject using suitable algorithms with the desired precision.

According to the invention, the measurement for a predetermined time or for multiple data acquisition cycles or repetitions (in particular for two cycles) can be implemented for coverage of the entire volume of the examination subject, or of an examination region thereof. A fixed time is predetermined such that data from the entire body volume of the patient are acquired in the case of a whole-body examination, or the entire volume of an examination region (for example the upper body) in the case of an examination of a body region, such that image gaps and entries no longer exist that cannot be remedied by means of a subsequent evaluation. The improved spatial selection that is provided by the use of the coil array is taken into account, such that (if applicable) images of a higher quality can be acquired in a comparably shorter measurement time. 1f a number of measurement cycles are implemented, for example given a fixed displacement of the gradient field, a double acquisition is thus normally sufficient so that the measurement time required in total can be kept low. Through multiple data acquisition cycles, a higher precision or better error prevention, which is necessary or desired under the circumstances, can be achieved.

In addition, the gradient coil system can be designed to generate at least one further periodic gradient field (in particular a displaceable gradient field) in another spatial direction (in particular a spatial direction essentially perpendicular to the direction of the first gradient field). These are separate fields that do not serve for displacement of the first gradient field. The single periodic gradient field or the multiple further periodic gradient fields can likewise be displaced (if applicable with respectively different speeds). The advantages that result due to the periodic gradients in one spatial direction can thus also be used for further spatial directions, thus (for example) for the x-direction and/or y-direction in addition to the z-direction.

The displacement of the gradient field in each direction ensues such that the displacement direction is not perpendicular to the direction of the periodicity. The displacement can in turn be achieved by a superimposition of further gradient fields, or by a movement of the patient that (given a suitable magnetic resonance apparatus) is possible not only in the direction of the longitudinal axis of the patient bed but also in further spatial directions normally situated perpendicularly thereto. It is also possible for one of the further gradients not to exhibit a sinusoidal or sawtooth shape, but instead it can be spatially constant and does not temporally vary during the data acquisition.

The application of further periodic gradients that can move is also possible independent of the use of individually-activatable coil arrays in the transmission and reception coil system. A measurement time reduction can also be achieved solely by the moving periodical gradients in a number of spatial directions.

For data acquisition in an inventive magnetic resonance apparatus, an examination subject on a bed is inserted into the opening of a magnetic resonance scanner that has a gradient coil system with which a gradient field that is periodic in one spatial direction is generated. Furthermore, the magnetic resonance apparatus has individually-activatable coil arrays in a transmission and reception coil system with which individual body regions are selectively excited in the data acquisition sequence or, a selective signal acquisition ensues. The examination subject is additionally influenced in terms of his or her position relative to the periodic gradient field, by either the examination subject (thus, for example, the patient) being displaced by displacing the bed in the corresponding spatial direction, or the periodic gradient field is displaced in this spatial direction. If the risk exists that such a displacement of the bed will be perceived as unpleasant by the patient, a displacement of the gradient field is suggested, for example by superposition of a further field.

In the implementation of the data acquisition, the measurement time thus can be shortened without problems (such as muscle convulsions or even pain impulses) occurring in the patient. Dual entries and image gaps in the exposure are avoided by the relative position change between the gradient field and the examination subject and by the used of individually-activatable coil arrays.

DESCRIPTION OF THE PREFERRED EMBODIMENTS

Figure 1:
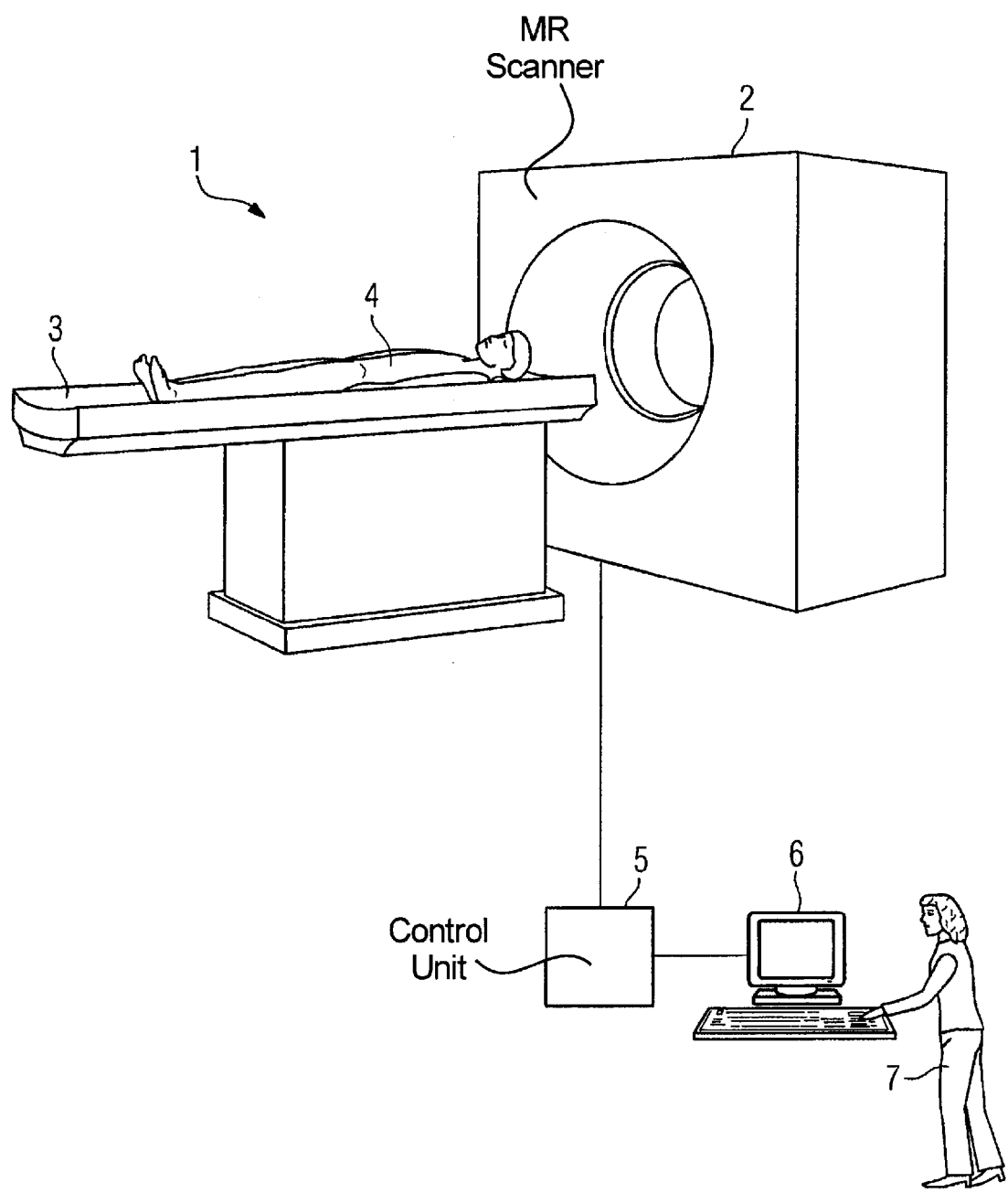
FIG. 1 schematically illustrates an inventive magnetic resonance apparatus.

FIG. 1 shows an inventive magnetic resonance apparatus 1 that has a magnetic resonance scanner 2 that with a transmission and reception (RF) coil system (not shown in FIG. 1) embodied therein as well as a gradient coil system. The gradient coil system of the magnetic resonance scanner 2 is designed for generation of a periodic gradient field in one spatial direction, here in the direction of the longitudinal axis of the magnetic resonance scanner 2. Located on the patient bed 3 is a patient 4 who is inserted into the magnetic resonance scanner 2 to undertake an examination (data acquisition).

The control of the examination of the patient 4 in the magnetic resonance scanner 2 ensues by means of a control device 5 that is connected with a user console 6 with an input device via which a physician 7 selects the examination to be undertaken. This selection is subsequently communicated to the control device 5 that set the parameters for the actual data acquisition conducted by the magnetic resonance scanner 2. The measurement time that is required for implementation of the examination is shortened by the use of the periodic gradient field of the gradient coil system of the magnetic resonance scanner 2, but gradient field arises (due to the periodicity) with flat segments exhibiting a slope of zero as well as edges exhibiting curves or flanks for which equal values are assumed, respectively, for the field.

Data are acquired to fill the regions around the peaks (maxima) of the gradient field by means of a relative displacement between the patient 4 and the periodic gradient field that is generated by the gradient coil system of the magnetic resonance scanner 2. This occurs depending on the type of the examination or on a selection by the physician 7 who directs the examination of the patient 4 in the magnetic resonance scanner 2 by either the patient bed 3 being displaced or the periodic gradient field being displaced, continuously or in stages in the longitudinal direction that is predetermined by the patient bed 3 as well as the magnetic resonance scanner 2. The RF transmission and reception coil system of the magnetic resonance scanner 2 (not shown In FIG. 1) has individually-activatable coil arrays with which it is possible (by suitable phase or amplitude modulations using interference effects) to excite or to not excite targeted individual regions of the body of the patient 4 in order to be able to correspondingly acquire specific and spatially-resolved arising MR signals. A further, more precise rendering with regard to the spatial association is thereby achieved in order to prevent ambiguous entries in the image acquisition.

According to the invention, a measurement time reduction can be achieved without a decrease in the precision of the spatial association. Depending on their design, the coil arrays (which can be activated individually) allow a very precise, rendering with regard to the location and with regard to the volume in the body of the patient 4 that is excited, and thus also with regard to the acquired data.

Figure 2A:
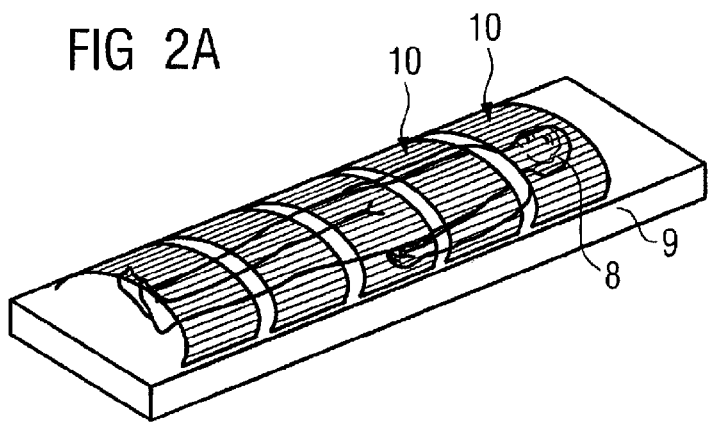
FIG. 2A shows an exemplary distribution of coil arrays around the body of a patient in accordance with the invention.

FIG. 2A shows an example for the distribution of coil arrays around the body of a patient 8. The patient 8 is located on a patient bed 9 that is inserted into the magnetic resonance scanner (not shown in FIG. 2A). Individually-activatable coil arrays 10 that surround the body of the patient 8 on the top and bottom are widely distributed around the body of the patient 8. Depending on the body area of the patient 8, one or more coil arrays 10 are provided, so a coverage of the entire body volume of the patient 8 is achieved and thus a whole-body examination is enabled. The coil arrays 10 (shown here with the same size and external shape for reasons of representation) are fashioned differently depending on the measurement requirements that are placed on the associated magnetic resonance apparatus, such that possible smaller coil arrays 10 can be provided in a larger number for body regions supplying a particularly large amount of measurement data, etc.

Since the coil arrays 10 (which can be composed of individual coil elements) can be activated individually, specific individual regions in the body of the patient 8 can be excited, for which interferences (arising by means of modulations of the phase or amplitude) are utilized. By suitable physical arrangement of the coil array 10, or a suitable activation, a very precise spatial selection can be achieved upon transmission and reception.

Figure 2B:
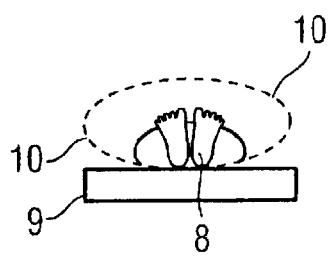
FIG. 2B shows the distribution of FIG. 2A in a further view.

FIG. 2B shows the array distribution of FIG. 2A in a further view at the foot end of the patient bed 9, on which the patient 8 is shown. The body volume of the patient 8 is covered by coil arrays 10 above and below the patient. The number of the coil arrays 10 of the transmission and reception coils varies depending on the precision required for the excitation. In regions in which data should be acquired with a high precision as to the spatial association, a higher number of coil arrays 10 are provided. The design or arrangement of the coil array 10 is also dictated according to how a predetermined magnetic resonance apparatus is predominantly used, meaning according to which examinations are predominantly conducted and for which purpose with the apparatus.

Figure 3:
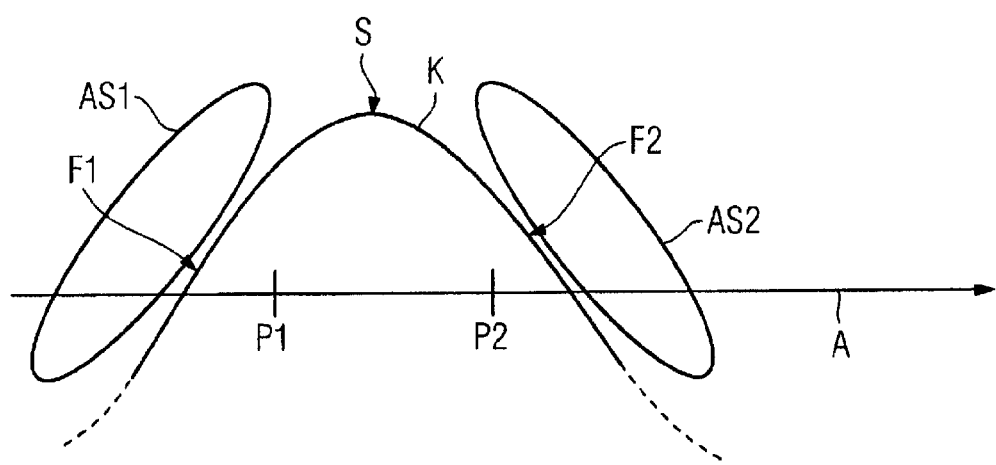
FIG. 3 illustrates spatial selection by means of individually-activatable coil arrays in accordance with the invention.

A basic sketch regarding the spatial selection by means of individually-activatable coil arrays is shown in FIG. 3. The spatial direction of the periodicity of the gradient field (which here is shown only in a small section region) is plotted on the horizontal axis A. The field curve (shown here as a curve K) of the periodic gradient field corresponds to a smooth wave with a peak region S that proceeds smoothly as well as edges F1 and F2 with an essentially linear field curve. On the axis A, two points P1 and P2 are drawn that exhibit respectively identical spacing from with regard to the peak region S of the curve K and which thus are associated with identical field values of the curve K. Dual (ambiguous) entries thus result with regard to both edges F1 and F2 that must be taken into account in the production or evaluation of images with the magnetic resonance apparatus.

This problem is avoided in accordance with the invention by the individually-activatable coil arrays that are used, with which it is possible to select specific areas in the body of an examination subject. The area selection is clarified by the spatial alignment of the area selections AS1 as well as AS2. With the coil arrays it can be spatially resolved very precisely which regions in the body volume of the patient have been excited, or with which regions a correspondingly-acquired signal is to be associated. For example, by the area selection according to AS1 and AS2, it can be detected whether a measured signal is associated with the point P1 or the point P2 on the rising or falling edges F1, F2 of the curve K, so ambiguous entries are optimally suppressed. This can be implemented in addition to previously known methods for spatial information association. A significantly better spatial selection is possible than in the case of a pure use of local transmission coils or reception coils, which spatial selection can nevertheless additionally be used in less critical regions.

The separate activation capability of the individual coil arrays enables even complicated exposures (which can possibly also be based on more complicated periodic gradient fields than sawtooth or sinusoidal fields) to be resolved with spatial precision. For optimal utilization of the magnetic resonance apparatus with a stress (due to the measurement method sometimes perceived as unpleasant) of the patient simultaneously kept as low as possible, the measurement times can be kept short without the patient having to suffer pain impulses or muscle contractions.

Figure 4:
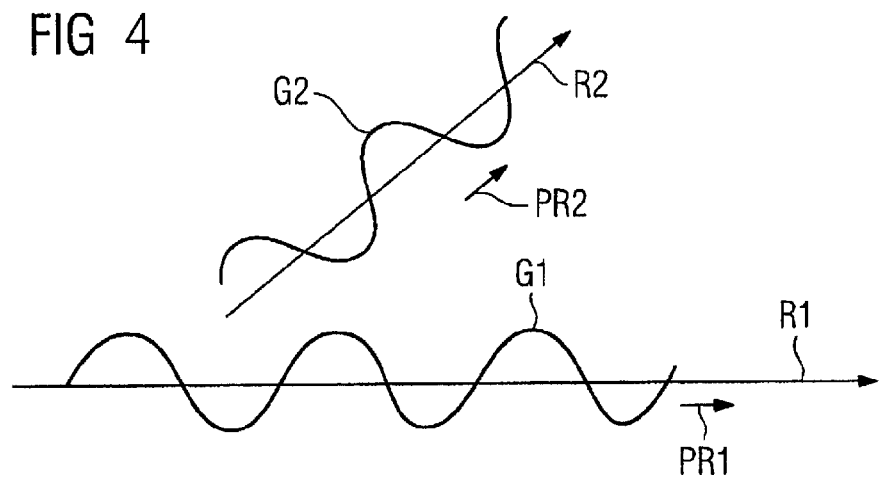
FIG. 4 shows periodic gradient fields in different spatial directions in accordance with the invention.

Shown in FIG. 4 illustrates periodic gradient fields G1 and G2 that move in different spatial directions R1 and R2, symbolized here by the directions of the corresponding axes. The displacement of both sinusoidal gradient fields G1 and G2 and indicated by the two arrows PR1 and PR2. This displacement of the gradient fields G1 and G2 ensues with different speeds and is achieved by either a further gradient field being superimposed or the patient being displaced in the spatial direction R1 or R2. By the use of such periodic gradient fields G1, G2 that are formed in different spatial directions, fast two-dimensional and three-dimensional individual image exposures can be acquired as needed. A signal acquisition can ensue both during a continuous displacement and after a predetermined displacement of a gradient field, where displacement ensues in stages (steps).

Although modifications and changes may be suggested by those skilled in the art, it is the intention of the inventors to embody within the patent warranted hereon all changes and

We claim as our invention:

1. A magnetic resonance apparatus comprising:

a magnetic resonance scanner comprising a radio frequency transmission and reception coil system, and a gradient coil system that generates a gradient field that is periodic in one spatial direction;

a patient bed adapted in order to receive a patient thereon and in order to move said patient within said magnetic resonance scanner;

said radio frequency transmission and reception coil system comprising a plurality of individually activatable coil arrays; and a control unit connected to said magnetic resonance scanner and to said patient bed that operates said magnetic resonance scanner in order to execute a magnetic resonance data acquisition sequence comprising multiple data acquisition repetition cycles, in which said control unit operates said gradient coil system in order to generate a gradient field that periodically changes with a periodicity in one spatial direction within each of said repetitions, and that operates one of said patient bed and said gradient coil system in order to produce a relative displacement in position between a patient on the patient bed and the gradient field along a spatial direction of the periodicity of the gradient field, and that individually activates said coil arrays in order to substantially avoid ambiguities in said magnetic resonance data acquired in the respective repetitions resulting from the gradient field being periodic.

2. A magnetic resonance apparatus as claimed in claim 1 wherein said individually-activatable coil arrays are disposed so as to be at least partially distributed around a body of the examination subject on the patient bed.

3. A magnetic resonance apparatus as claimed in claim 1 wherein said individually-activatable coil arrays are disposed so as to be distributed around an entirety of a body volume of an examination subject on the patient bed.

4. A magnetic resonance apparatus as claimed in claim 1 wherein said control unit individually activates said individually-activatable coil arrays In order to selectively excite specified regions of the body of an examination subject by modulation, selected from the group consisting of phase modulation and amplitude modulation, of respective currents supplied to the coil arrays.

5. A magnetic resonance apparatus as claimed in claim 1 wherein said control unit effects said relative displacement continuously.

6. A magnetic resonance apparatus as claimed in claim 1 wherein said control unit effects said relative displacement in successive steps.

7. A magnetic resonance apparatus as claimed in claim 1 wherein said control unit displaces said gradient field by causing a further periodic gradient field to be generated by said gradient coil system, said further gradient field being superimposed on said gradient field.

8. A magnetic resonance apparatus as claimed in claim 1 wherein said control unit operates said gradient coil system in order to generate said periodic gradient field with a sawtooth field shape.

9. A magnetic resonance apparatus as claimed in claim 1 wherein said control unit operates said gradient coil system in order to generate said periodic gradient field with a smoothly varying, substantially sinusoidal shape.

10. A magnetic resonance apparatus as claimed in claim 1 wherein said control unit operates said magnetic resonance scanner in order to acquire data from a volume of the examination subject, and wherein said control operates said magnetic resonance scanner in order to acquire said data for a predetermined time in order to acquire said data from an entirety of said volume.

11. A magnetic resonance apparatus as claimed in claim 1 wherein said control unit operates said magnetic resonance scanner in order to acquire data from a volume of the examination subject, and wherein said control operates said magnetic resonance scanner in order to acquire said data through said multiple data acquisition repetition cycles in order to acquire said data from an entirety of said volume.

12. A magnetic resonance apparatus as claimed in claim 1 wherein said control unit operates said gradient coil system in order to generate at least one further period gradient field in a spatial direction that is substantially perpendicular to the spatial direction of said periodic gradient field.

* * * * *